United States Patent [19]

Anttila et al.

[11] Patent Number: 5,518,596

[45] Date of Patent: May 21, 1996

[54] PROCEDURE AND APPARATUS FOR IMPROVING A PLASMA ACCELERATOR PLATING APPARATUS USED FOR DIAMOND PLATING

[75] Inventors: Asko Anttila, Helsinki; Jari Koskinen, Vantaa, both of Finland

[73] Assignee: Suomen Itsenaisyyden Juhlarahasto Sitra, Helsinki, Finland

[21] Appl. No.: 256,256

[22] PCT Filed: Dec. 30, 1992

[86] PCT No.: PCT/FI92/00366

§ 371 Date: Nov. 9, 1994

§ 102(e) Date: Nov. 9, 1994

[87] PCT Pub. No.: WO93/14239

PCT Pub. Date: Jul. 22, 1993

[30] Foreign Application Priority Data

Jan. 10, 1992 [FI] Finland ................. 920122

[51] Int. Cl.⁶ ................. C23C 14/32
[52] U.S. Cl. ................. 204/192.38; 204/298.41; 427/580
[58] Field of Search ................. 204/192.38, 298.41; 427/580

[56] References Cited

U.S. PATENT DOCUMENTS 4,849,088  7/1989  Veltrop et al. ................. 204/298.41
5,078,848  1/1992  Anttila et al. ................. 204/192.38

FOREIGN PATENT DOCUMENTS 89-06708  7/1989  WIPO.

OTHER PUBLICATIONS

Gilmour, A. S. et al., "Pulsed Metallic–Plasma Generators", Proceedings of the IEEE, vol. 60, No. 8, Aug. 1972, pp. 977–991.

*Primary Examiner*—Aaron Weisstuch
*Attorney, Agent, or Firm*—Ronald J. Kubovcik

[57] ABSTRACT

A plating apparatus used in a diamond plating process in which a first electrode having a surface from which plating material is released is located in connection with a firing electrode to generate a first arc, the first arc being used to start a second arc between the first electrode and a second electrode, and in which apparatus a plasma spray formed from plating material released from the first electrode is directed toward a substrate to be plated includes a grinding element in contact with the surface of the first electrode and a mechanism for rotating the surface of the first electrode. The grinding element may be a firing electrode or an abrading tool. A method of operating the plating apparatus includes abrading the surface of the first electrode from which plating material is released.

10 Claims, 1 Drawing Sheet

PROCEDURE AND APPARATUS FOR IMPROVING A PLASMA ACCELERATOR PLATING APPARATUS USED FOR DIAMOND PLATING

FIELD OF THE INVENTION

The present invention relates to a plating apparatus used in a diamond plating process and a method of operating the plating apparatus.

BACKGROUND OF THE INVENTION

Diamond and diamondlike platings and films have a number of properties resembling those of corresponding traditional diamonds. The first property is hardness. Another significant mechanical property is a low friction coefficient. The resistance to wear is also excellent. Moreover, such a plating or film remains unchanged in all known bases and acids. Thus, diamondlike platings and films are especially applicable for the coating of bodies subject to wear and corrosion, such as non-lubricated bearings. Another notable feature is the high refraction coefficient of diamonds.

WO publication 89/06708 presents an apparatus for diamond plating. The apparatus described in this publication works by forming from carbon by means of a plasma accelerator a plasma spray which is accelerated and deflected toward the body to be plated. The plasma accelerator has a cylindrical graphite cathode, A conducting rod serving as a firing device is placed inside the cathode.

During plating, carbon in the form of charged ions and uncharged atoms is released from the cathode. The surface of the cathode which releases carbon is subject to erosion, which may manifest itself, e.g., in the form of microscopic holes appearing in the cathode surface, producing spongy structures. At first, the arc is normally started from the cathode surface, but with the progress of erosion the starting of the arc occurs more and more frequently at the bottom of the holes. Gradually the holes are covered up and the cathode becomes incapable of emitting a plasma pulse.

For this reason, the cathode surface has to be smoothed out. This is generally accomplished by removing the cathode and refacing it, e.g., by turning. This is a complicated procedure, however. Moreover, it is impossible to keep the plating apparatus running continuously for a long time. Typically, the cathode has to be refaced every few hours.

SUMMARY OF THE INVENTION

The object of the present invention is to achieve an improvement in diamond plating equipment using known techniques. The procedure of the invention for improving a plating apparatus is characterized in that the plasma surface of the cathode is continuously ground by means of a grinding blade or other equivalent grinding device.

Using the procedure of the invention, it is possible to achieve a decisive improvement in the usability of a diamond plating apparatus. The procedure of the invention allows continuous use of the plating apparatus as it does not require removal of the cathode for grinding or turning.

BRIEF DESCRIPTION OF THE DRAWINGS

In the following, the invention is described in detail by the aid of an example by referring to the attached drawings, in which.

DETAILED DESCRIPTION OF THE INVENTION

Using a plasma accelerator, a plasma spray is produced from carbon and accelerated toward the body to be plated. The plasma spray is deflected by means of a magnetic field, whereupon it hits the surface of the body under treatment. Both the plasma accelerator and the body being plated are placed in a vacuum.

Figure 1:
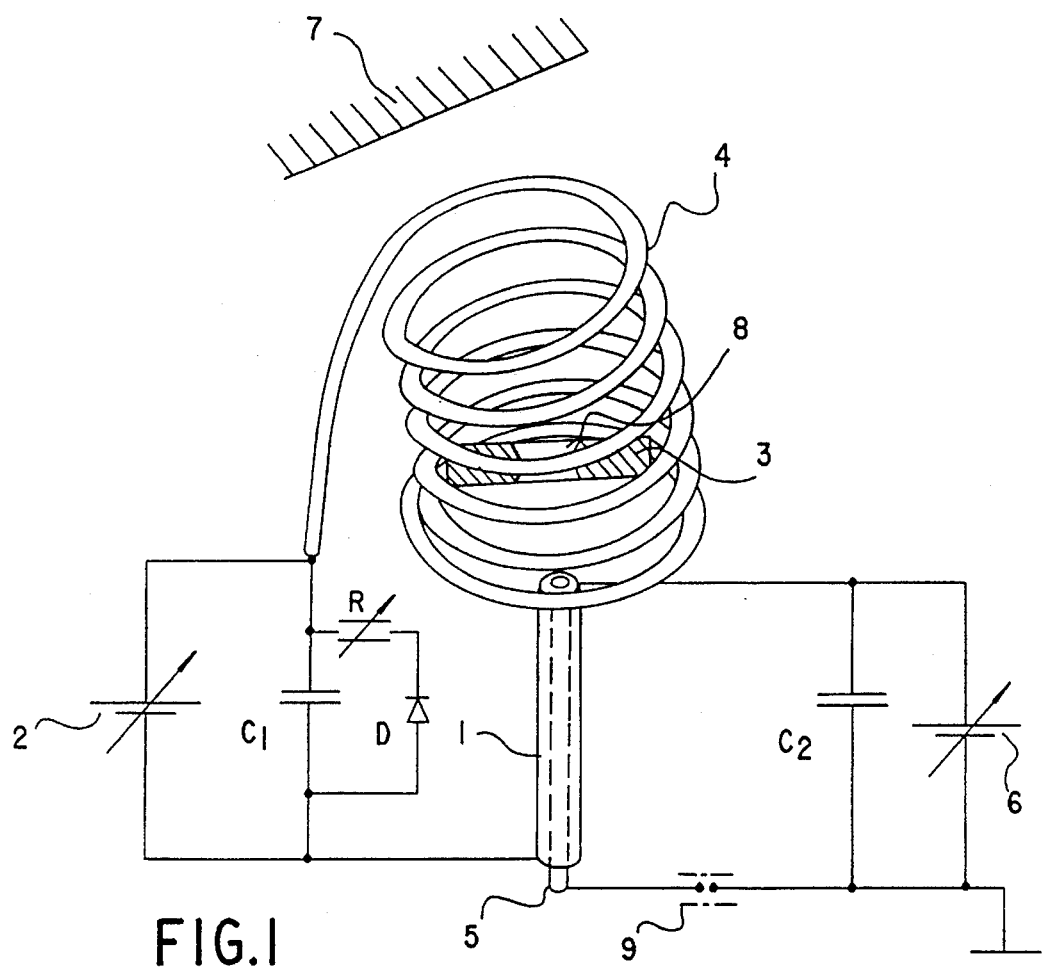
FIG. 1 presents a diamond plating apparatus as described in WO publication 89-06708.

Referring to FIG. 1, the plasma accelerator has a cylindrical cathode 1 consisting of solid carbon. The cathode is connected to the negative terminal of a first voltage source and to one terminal of a first capacitor C1. A discoidal anode 3 with a hole in the middle is connected to a cylindrical coil 4 made of copper wire. The coil has a bent shape and one end thereof is connected to the positive terminal of the first voltage source and to the other terminal of the first capacitor C1. Also connected to the terminals of capacitor C1 are a diode D and an adjustable resistor R. The cathode 1 is partly surrounded by the coil 4 and the anode 3 is completely surrounded by the coil 4.

Inside the cathode 1 is a conducting metal rod 5. Together with a second voltage source 6 and a second capacitor C2, the cathode 1 and the metal rod 5 form a firing circuit. The second voltage source 6 is adjustable. The cathode 1 is connected to the positive terminal of the second voltage source 6 and to one terminal of the second capacitor C2. The metal rod 5 is connected to the negative terminal of the second voltage source 6 and to the other terminal of the second capacitor C2.

A substrate 7 is plated by means of the plasma accelerator as follows. From the first voltage source 2, the first capacitor C1, connected in parallel with it, is charged. From the second voltage source 6, the second capacitor C2, which is connected in parallel with this voltage source, is charged until a spark-over occurs in the air gap between the cathode 1 and the metal rod 5, producing an arc in this air gap. This arc discharges the second capacitor C2 and strikes another arc between the cathode 1 and the anode 3. In this situation, the cathode 1 begins to release carbon in the form of charged ions and uncharged atoms. The arc between cathode 1 and anode 3 causes the first capacitor C1 to be discharged. The arc is extinguished when the capacitor voltage falls below the level required for sustaining an arc. In this way, the carbon ions and atoms form a pulsed-shaped plasma spray. The pulse duration is determined by the capacitance of capacitor C1.

Connected in parallel with the first capacitor C1 are a diode D, whose function is to eliminate the opposing voltage produced at the terminals of the first capacitor C1 by the oscillating circuit formed by the first capacitor Cl and the winding 4, and an adjustable resistor R protecting the diode D.

The plasma spray is accelerated by the magnetic field generated by the winding 4. Since the winding has a bent shape, the charged ions passing through the hole 8 in the anode 3 are deflected by the magnetic field, whereas the uncharged particles advance straight ahead without encountering the substrate 7 and are thus separated from the charged ions. The substrate 7 to be plated is placed near that end of the winding 4 which is connected to the first voltage source 2 and first capacitor C1. Since the magnetic field generated by the winding deflects the charged ions but not the uncharged particles, the substrate to be plated is bombarded only by ions accelerated by the magnetic field.

Figure 2:
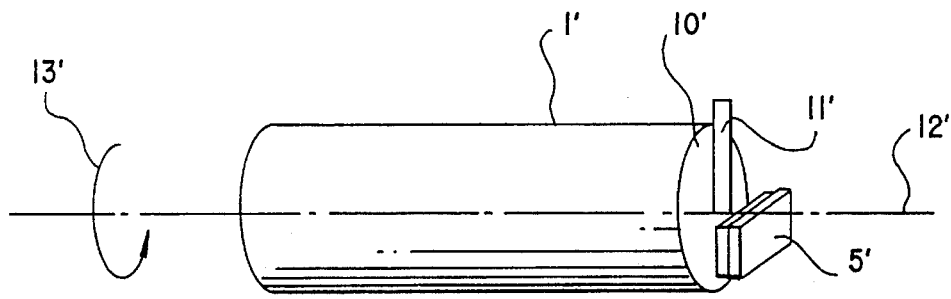
FIG. 2 presents a diamond plating apparatus according to the present invention.

FIG. 2 presents a diamond plating apparatus in accordance with the present invention. The apparatus has a solid barlike graphite cathode 1'. The firing electrode 5' is placed near the end face (emitting surface) 10' of the cathode, from which the carbon used for the plating is released. The firing electrode 5', whose lower surface is in contact with the cathode, is a rectangular body of a width nearly equal to the radius of the cathode. Placed on the emitting surface 10' is an abrading tool 11' provided with a sharp abrading surface which has a width slightly exceeding the radius of the cathode 1'. The abrading tool 11' is placed in contact with the end face (emitting surface) 10' of the cathode.

During plating, the cathode 1' is rotated about its longitudinal axis 12' by means of a rotating mechanism (not shown). Thus, the end face (emitting surface) 10' of the cathode is continuously ground by the abrading tool and therefore remains smooth all the time. The cathode surface is also abraded by the firing electrode. The rotating mechanism can also be provided with, e.g., hydraulic equipment designed to push the cathode toward the abrading tool 11' according to the erosion of the emitting surface 10'. In this case the abrading tool 11' also serves as a motion limiter.

It is obvious to a person skilled in the art that different embodiments of the invention are not restricted to the examples described above, but that they may instead be varied within the scope of the following claims.

We claim:

1. A method of operating a plating apparatus used in a diamond plating process, in which plating process a first arc is started between a first electrode having a surface from which plating material is released, and a firing electrode placed in connection to the first electrode, another arc is started by means of the first arc between the first electrode and a second electrode, and a plasma beam formed from plating material released from the surface of the first electrode is directed toward the substrate to be plated, said method comprising abrading the surface of the first electrode from which plating material is released.

2. The method of claim 1, wherein the surface of the first electrode is abraded by placing a grinding element in contact with the surface and moving the surface relative to the grinding element.

3. The method of claim 2, wherein the surface of the first electrode is rotated.

4. The method of claim 1, wherein the surface of the first electrode is abraded by placing a grinding element in contact with the surface and moving the grinding element relative to the surface.

5. In combination with a plating apparatus used in a diamond plating process in which a first electrode having a surface from which plating material is released is located in connection with a firing electrode to generate a first arc, said first arc being used to start a second arc between the first electrode and a second electrode, and in which apparatus a plasma spray formed from plating material released from the first electrode is directed toward a substrate to be plated, means for abrading the surface of the first electrode from which plating material is released.

6. The combination of claim 5, further comprising means for compensating for the erosion of the first electrode, said compensating means being adapted to move the first electrode according to the degree of erosion so that the surface thereof remains essentially in the same location relative to the means for abrading.

7. In combination with a plating apparatus used in a diamond plating process in which a first electrode having a surface from which plating material is released is located in connection with a firing electrode to generate a first arc, said first arc being used to start a second arc between the first electrode and a second electrode, and in which apparatus a plasma spray formed from plating material released from the first electrode is directed toward a substrate to be plated, a grinding element in contact with the surface of the first electrode; and means for rotating the surface of the first electrode.

8. The combination of claim 7, wherein the grinding element is a firing electrode.

9. The combination of claim 7, wherein the grinding element is an abrading tool.

10. The combination of claim 7, further comprising means for compensating for the erosion of the first electrode, said compensating means being adapted to move the first electrode according to the degree of erosion so that the surface thereof remains essentially in the same location relative to the grinding element.

* * * * *